United States Patent
Jung et al.

(10) Patent No.: US 11,569,113 B2
(45) Date of Patent: Jan. 31, 2023

(54) UNIT CELL ALIGNMENT APPARATUS HAVING TILTABLE AND ROTATABLE BASE MEMBER

(71) Applicant: LG CHEM, LTD., Seoul (KR)

(72) Inventors: Tai Jin Jung, Daejeon (KR); Cha Hun Ku, Daejeon (KR); Jung Kwan Pyo, Daejeon (KR); Byeong Kyu Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 332 days.

(21) Appl. No.: 16/733,704

(22) Filed: Jan. 3, 2020

(65) Prior Publication Data

US 2020/0144089 A1 May 7, 2020

Related U.S. Application Data

(63) Continuation of application No. PCT/KR2019/002329, filed on Feb. 26, 2019.

(30) Foreign Application Priority Data

Mar. 6, 2018 (KR) .................. 10-2018-0026474

(51) Int. Cl.
*H01L 21/68* (2006.01)
*B65G 27/02* (2006.01)
(Continued)

(52) U.S. Cl.
CPC ............. *H01L 21/68* (2013.01); *B65G 27/02* (2013.01); *H01L 21/67706* (2013.01); *H01M 10/0404* (2013.01)

(58) Field of Classification Search
CPC ... B65G 27/02; B65G 57/02; H01L 21/67706; H01L 21/68; H01M 10/04;
(Continued)

(56) References Cited

U.S. PATENT DOCUMENTS

| 2002/0133937 A1* | 9/2002 | Mochida .............. H05K 3/1216 29/840 |
| 2018/0145294 A1 | 5/2018 | Choi et al. |
| 2020/0144089 A1* | 5/2020 | Jung ....................... H01L 21/68 |

FOREIGN PATENT DOCUMENTS

| CN | 203461595 U | 3/2014 |
| CN | 104737351 A | 6/2015 |

(Continued)

OTHER PUBLICATIONS

International Search Report (PCT/ISA/210) issued in PCT/KR2019/002329, dated Jun. 12, 2019.

*Primary Examiner* — Minh N Trinh
(74) *Attorney, Agent, or Firm* — Birch, Stewart, Kolasch & Birch, LLP

(57) ABSTRACT

A unit cell alignment apparatus that includes a base member, on the upper surface of which unit cells constituting an electrode assembly are stacked parallel thereto, a first guide member located at one side of the base member, the first guide member being disposed so as to be perpendicular to the upper surface of the base member, a second guide member located at the base member, the second guide member being disposed so as to be perpendicular to the upper surface of the base member while being at right angles to the first guide member, and an inclination adjustment member configured to adjust the inclination of the base member.

13 Claims, 9 Drawing Sheets

(51) Int. Cl.
*H01L 21/677* (2006.01)
*H01M 10/04* (2006.01)

(58) Field of Classification Search
CPC ......... H01M 10/0404; H01M 10/0413; H01M 10/052; H01M 10/0585
See application file for complete search history.

(56) References Cited

FOREIGN PATENT DOCUMENTS

| | | |
|---|---|---|
| CN | 107615516 A | 1/2018 |
| JP | 2001-313493 A | 11/2001 |
| JP | 2010-113997 A | 5/2010 |
| JP | 2010-212139 A | 9/2010 |
| JP | 2012-91372 A | 5/2012 |
| JP | 2012-137631 A | 7/2012 |
| KR | 20-0206056 Y1 | 12/2000 |
| KR | 10-052081 B1 | 11/2005 |
| KR | 10-1241173 B1 | 3/2013 |
| KR | 10-2015-0050217 A | 5/2015 |
| KR | 10-2015-0050219 A | 5/2015 |
| KR | 10-2016-0107570 A | 9/2016 |
| KR | 10-2017-0052962 A | 5/2017 |
| KR | 10-2017-0118447 A | 10/2017 |

\* cited by examiner

[FIG. 1]
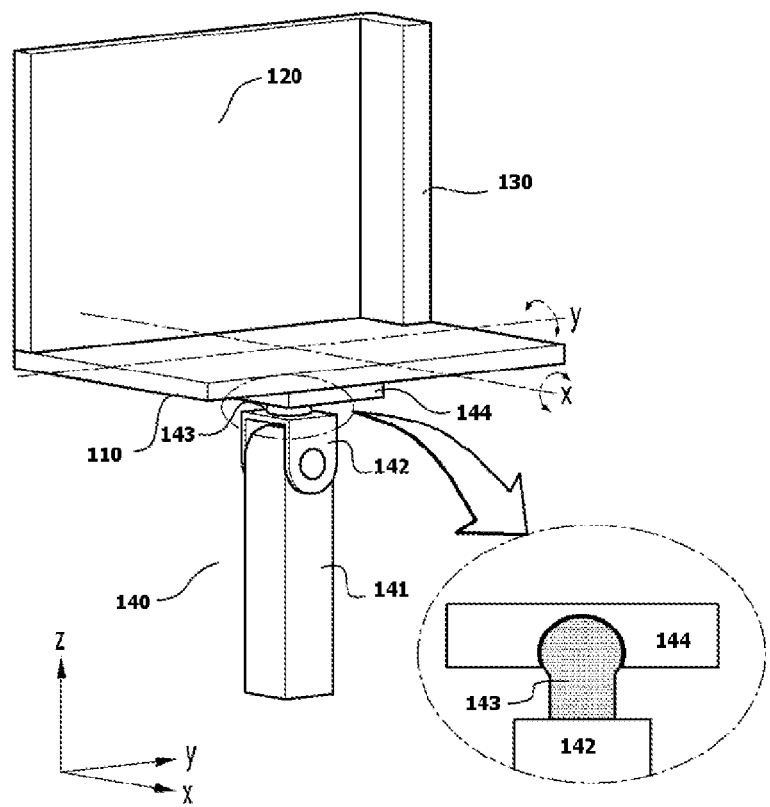

[FIG. 2]
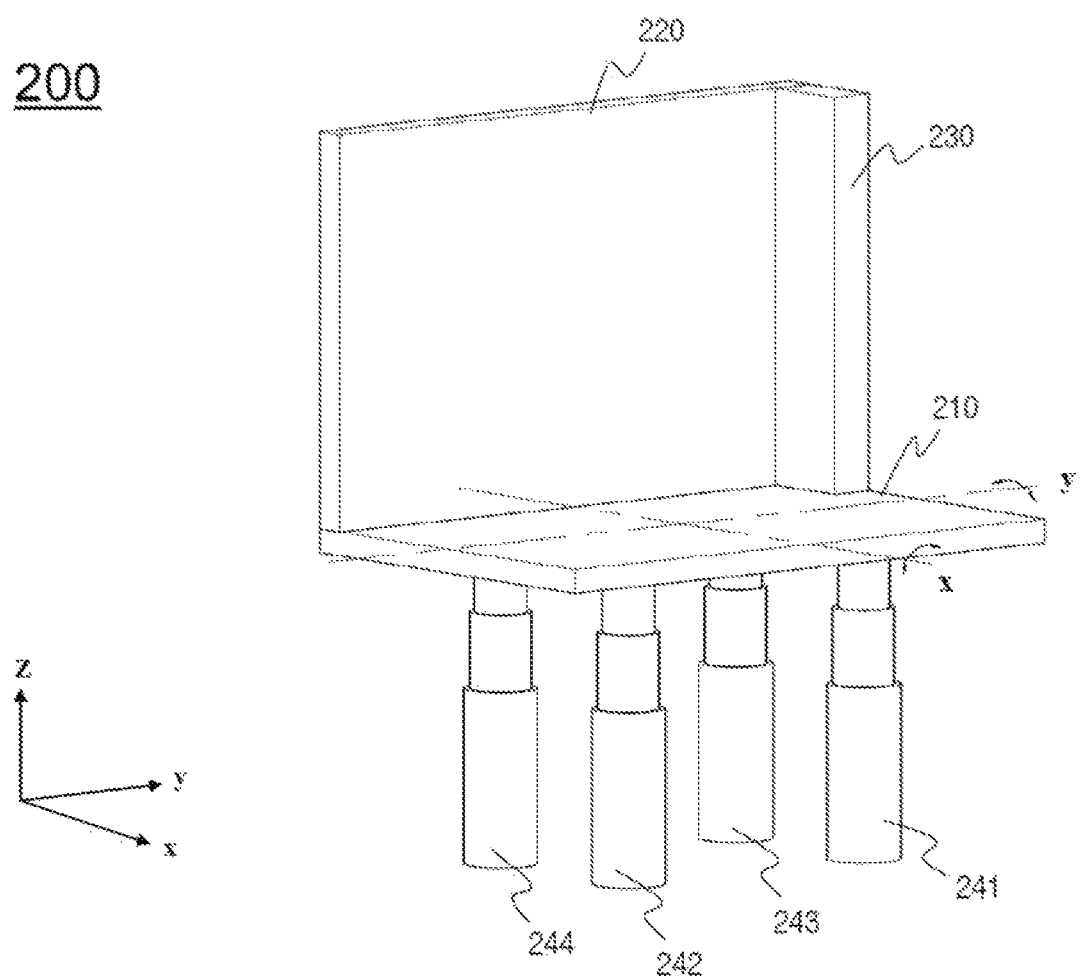

[FIG. 3]
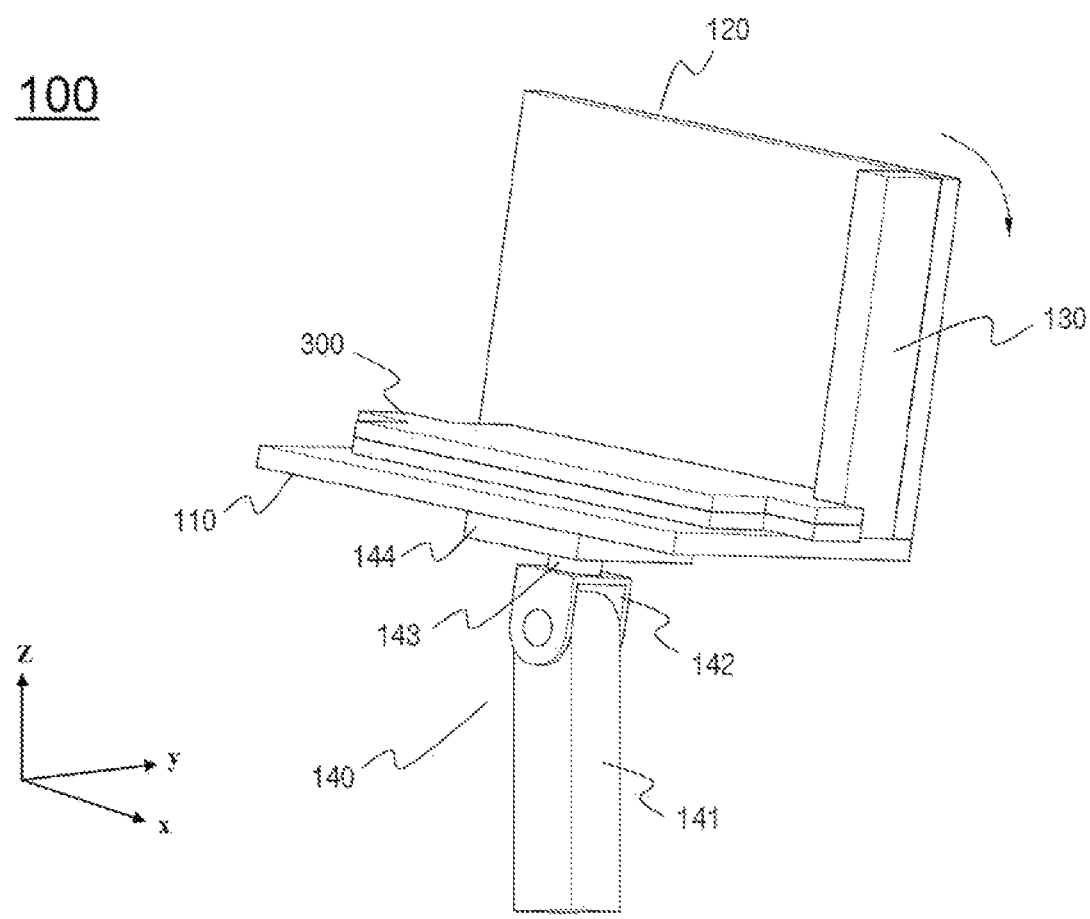

[FIG. 4]
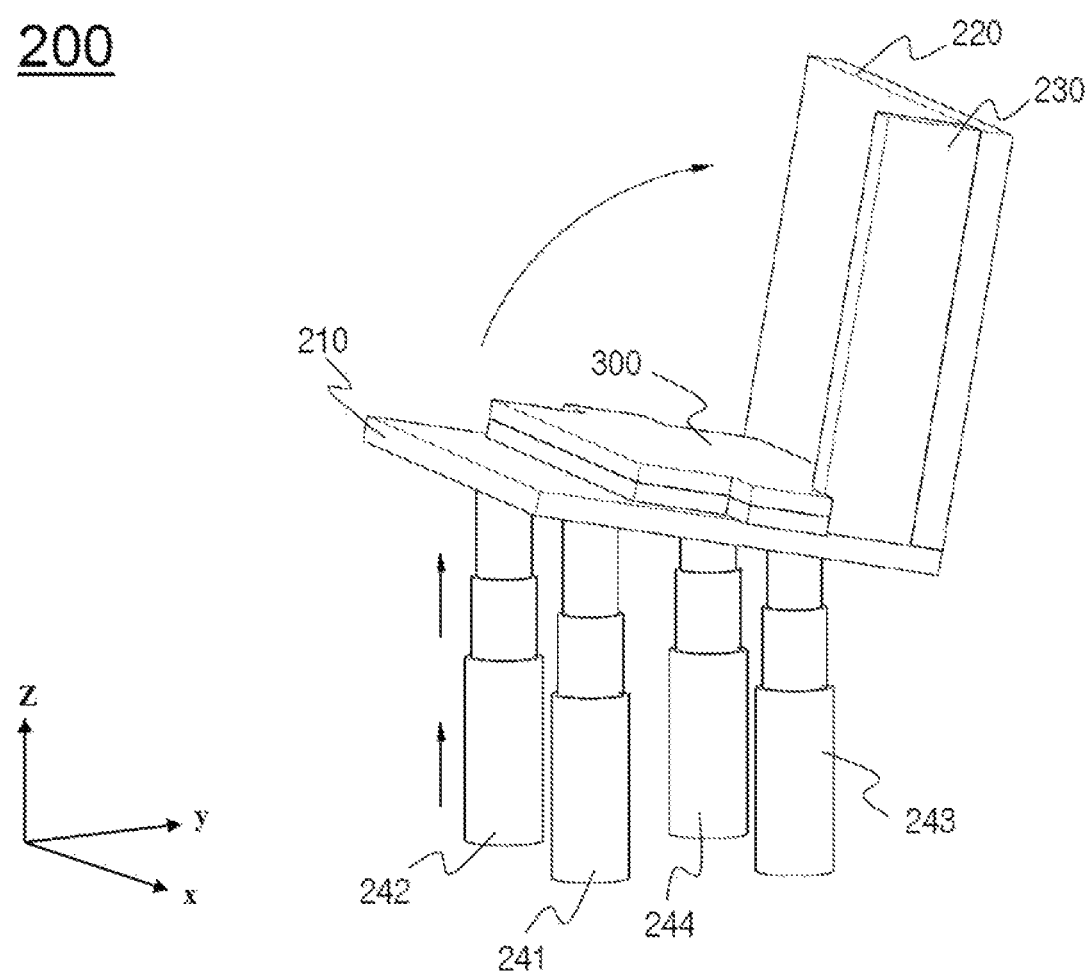

[FIG. 5]
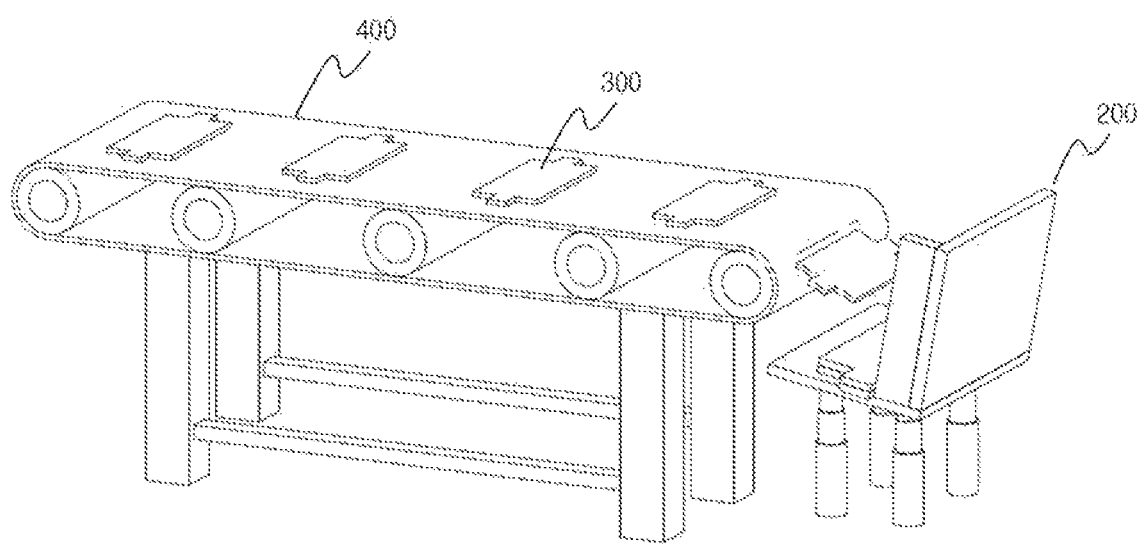

[FIG. 6]
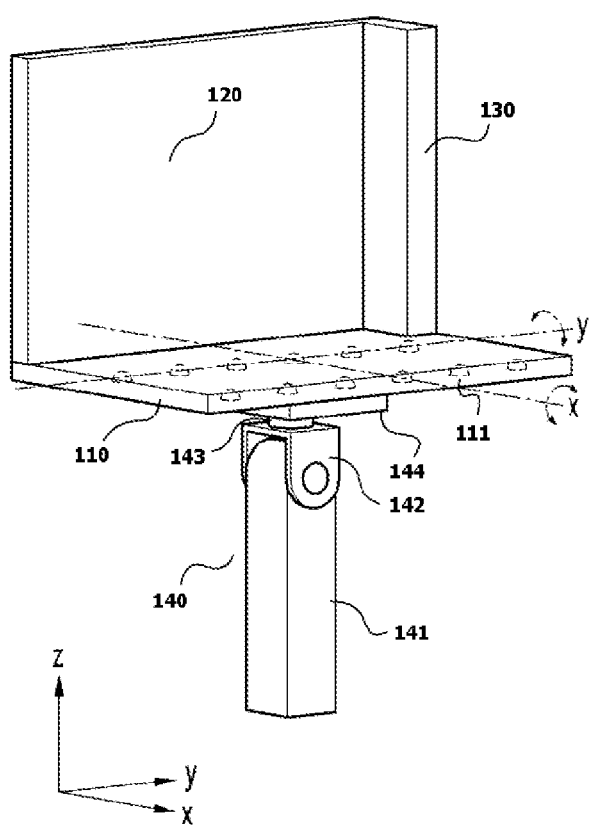

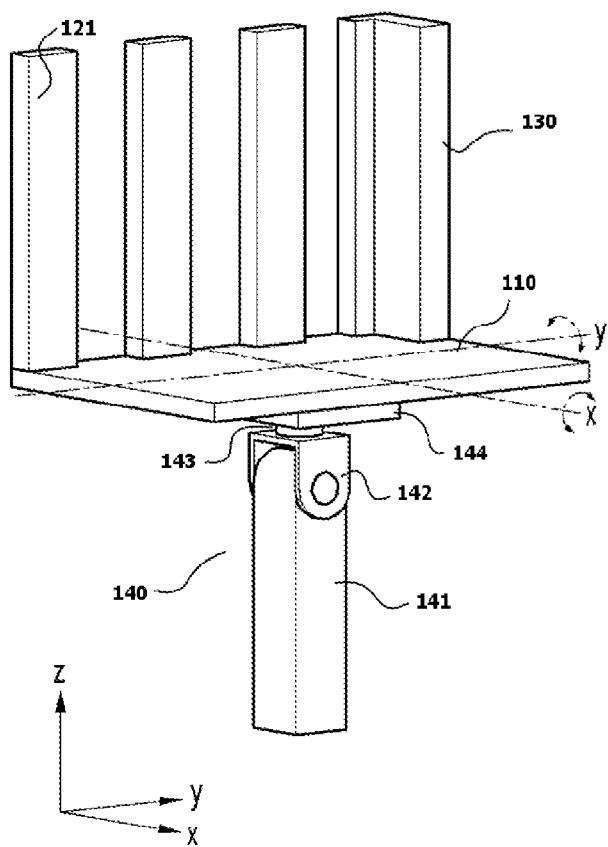
[FIG. 7]

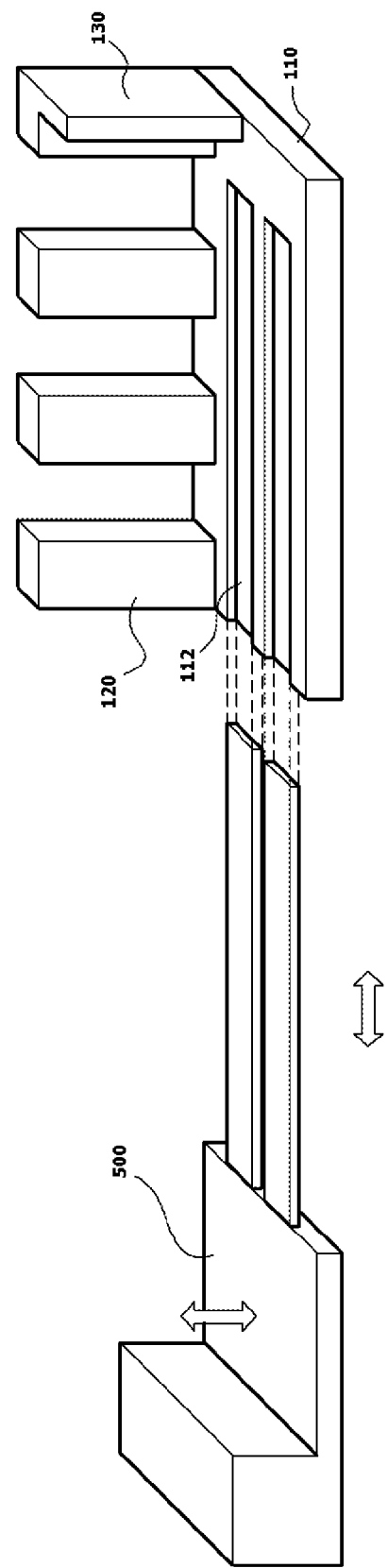

[FIG. 9]
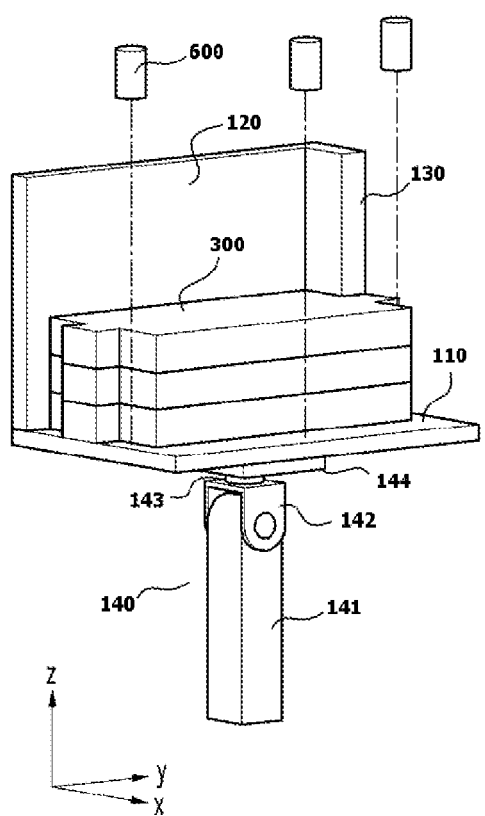

UNIT CELL ALIGNMENT APPARATUS HAVING TILTABLE AND ROTATABLE BASE MEMBER

This application is a by-pass continuation of PCT/KR2019/002329, filed Feb. 26, 2019, which claims the benefit of Korean Patent Application No. 2018-0026474 filed on Mar. 6, 2018 with the Korean Intellectual Property Office, the disclosures of which are herein incorporated by reference in their entirety.

TECHNICAL FIELD

The present invention relates to a unit cell alignment apparatus for the manufacture of an electrode assembly, and more particularly to an apparatus for stacking unit cells on a stacking table in a dropping fashion and aligning the unit

BACKGROUND ART

Secondary batteries, which are capable of being charged and discharged, have attracted considerable attention as power sources for transportation means requiring high output and large capacity, including an electric vehicle (EV), a hybrid electric vehicle (HEV), and a plug-in hybrid electric vehicle (Plug-In HEV), which have been proposed as alternatives to existing gasoline and diesel vehicles. The use of a lithium secondary battery has been rapidly increasing, since the capacity of the lithium secondary battery is greater than the capacity of a nickel-cadmium battery or a nickel-hydride battery, which is mainly used as a power source for electronic equipment, and the energy density per unit weight of the lithium secondary battery is high.

Such a lithium secondary battery mainly uses a lithium-based oxide and a carbon material as a positive electrode active material and a negative electrode active material, respectively. The lithium secondary battery includes an electrode assembly, in which a positive electrode plate, to which the positive electrode active material is applied, and a negative electrode plate, to which the negative electrode active material is applied, are disposed in the state in which a separator is disposed therebetween, and a sheathing member, in which the electrode assembly is received together with an electrolytic solution in a sealed state.

Based on the shape of a battery case, the lithium secondary battery may be classified as a can-shaped secondary battery, in which the electrode assembly is mounted in a metal can, or a pouch-shaped battery, in which the electrode assembly is mounted in a pouch made of an aluminum laminate sheet. The can-shaped secondary battery may be classified as a cylindrical battery or a prismatic battery.

The electrode assembly may be classified as a jelly-roll type electrode assembly, in which a positive electrode plate and a negative electrode plate are wound in the state in which a separator is interposed therebetween, or a stacked type electrode assembly, in which unit cells, each of which includes a positive electrode plate, a negative electrode plate, and a separator interposed therebetween, are sequentially stacked. The stacked type electrode assembly is mainly used for a pouch-shaped battery, and the jelly-roll type electrode assembly is mainly used for a can-shaped secondary battery. The stacked type electrode assembly, which is configured to have a structure in which a plurality of unit cells is sequentially stacked, has come to be widely used, since the energy density per unit weight of the stacked type electrode assembly is high and the stacked type electrode assembly makes it easy to obtain a prismatic shape.

In the stacked type electrode assembly, two or more unit cells, each of which includes a positive electrode plate, a negative electrode plate, and a separator interposed between the positive electrode plate and the negative electrode plate, are stacked. In order to manufacture an electrode assembly manufactured by stacking the unit cells so as to meet a uniform standard, the unit cells must be stacked in an aligned state. In addition, an electrode assembly manufactured in the state in which unit cells are not properly aligned with each other has disadvantages in that the connection of electrode tabs between the unit cells is difficult and in that space is inefficiently used and thus energy density is low.

Patent Document 1 discloses a unit cell stacking jig including a vibration-generating unit configured to vibrate the unit cell stacking jig. In the unit cell stacking jig of Patent Document 1, unit cells are immediately aligned with each other as soon as the unit cells are properly inserted into the jig. In the case in which the unit cells are partially inserted into only a portion of the jig, the full insertion of the unit cells into the jig may be guided through the vibration-generating unit.

However, there is a limitation in ability to align the major axes and the minor axes of the unit cells using only vibration. Also, in an actual process, the unit cells are supplied through a conveyor belt, and drop toward the jig, whereby the unit cells are loaded into an alignment apparatus. In the case in which the unit cells drop to a region at which positional correction through vibration is difficult, however, the unit cells are not aligned with each other. Consequently, the apparatus of Patent Document 1 has little availability unless a separate sophisticated conveyor belt is provided.

Patent Document 2 discloses an apparatus for manufacturing an electrode assembly configured to have a structure in which a plurality of unit cells is wound together with a separation film in the state in which the unit cells are arranged on the separation film, wherein the apparatus is constructed to align the unit cells with each other using the rotation of a web-alignment roller. However, the above construction is applicable only to a structure in which unit cells are wound together with a separation film, but is difficult to apply to a laminated/stacked type electrode assembly.

Patent Document 3 discloses an alignment apparatus including a base unit provided with an air spray port configured to spray air toward a basic unit body or an auxiliary unit body. However, it is necessary to spray an amount of air sufficient to raise the basic unit body upwards from the surface of the base unit against the weight of the basic unit body, and it is difficult to achieve effective alignment merely by raising the basic unit body upwards.

Also, in Patent Document 3, fuel cells to be vertically aligned on a base member of the present invention are stacked, and therefore application to a general stacking apparatus, which is disposed horizontally, is difficult.

As described above, technology capable of efficiently solving problems with dropping, stacking, and alignment of unit cells, currently performed in many unit cell stacking processes, has not yet been proposed.

PRIOR ART DOCUMENT

Patent Document

Korean Patent Application Publication No. 2015-0050219
Korean Patent Application Publication No. 2017-0052962

Japanese Patent Application Publication No. 2010-212139

DISCLOSURE

Technical Problem

The present invention has been made in view of the above problems, and it is an object of the present invention to provide a unit cell alignment apparatus that is capable of effectively aligning unit cells in order to prevent some of the unit cells from not being located on the proper places thereof and deviating from the proper places thereof in a process of stacking the unit cells.

Technical Solution

In accordance with an aspect of the present invention, the above and other objects can be accomplished by the provision of a unit cell alignment apparatus including a base member having an upper surface for supporting a unit cell, a first guide member located at a first side of the base member, the first guide member being disposed so as to be perpendicular to the upper surface of the base member, a second guide member located at a second side of the base member, the second guide member being disposed so as to be perpendicular to the upper surface of the base member while being at a right angle to the first guide member, and an inclination adjuster configured to adjust the inclination of the base member.

In accordance with another aspect of the present invention, there is provided an electrode assembly manufacturing method using the unit cell alignment apparatus, the electrode assembly manufacturing method including (a) transferring a plurality of unit cells and sequentially stacking the plurality of unit cells on a base member, (b) a step of aligning the stacked unit cells, and (c) a step of assembling the stacked and aligned unit cells.

Step (b) may be performed using the unit cell alignment apparatus.

In order to align the stacked unit cells at step (b), the inclination of the base member may be adjusted or vibration may be applied to the stacked unit cells.

In the case in which the unit cells are transferred in the state in which the base member has an inclined structure, step (a) and step (b) may be simultaneously performed.

Step (a) and step (b) may be repeatedly performed a number of times in order to form an electrode assembly in which the unit cells are stacked, and then step (c) may be performed.

In accordance with a further aspect of the present invention, there is provided a stacked type electrode assembly manufactured using the unit cell alignment apparatus.

DESCRIPTION OF DRAWINGS

FIG. 1 is a perspective view showing a unit cell alignment apparatus according to an embodiment of the present invention.

FIG. 2 is a perspective view showing a unit cell alignment apparatus according to another embodiment of the present invention.

FIG. 3 is a perspective view showing the state in which the unit cell alignment apparatus of FIG. 1 is moved in a second direction.

FIG. 4 is a perspective view showing the state in which the unit cell alignment apparatus of FIG. 2 is moved in a first direction.

FIG. 5 is a perspective view showing that unit cells are transferred to a unit cell alignment apparatus through a unit cell transfer apparatus and are then stacked in the unit cell alignment apparatus.

FIG. 6 is a perspective view showing in detail the unit cell alignment apparatus of FIG. 1 and a vibration member inside the base member added thereto.

FIG. 7 is a perspective view showing a modified embodiment of the unit cell alignment apparatus of FIG. 1 in which a first guide member of the unit cell alignment apparatus of FIG. 1 is modified into discontinuous unit members.

FIG. 8 is a perspective view showing a transfer apparatus.

FIG. 9 is a perspective view showing the unit cell alignment apparatus of FIG. 1 and alignment measurement members added thereto.

BEST MODE

A unit cell alignment apparatus according to the present invention includes a base member having an upper surface for supporting a unit cell, a first guide member located at a first side of the base member, the first guide member being disposed so as to be perpendicular to the upper surface of the base member, a second guide member located at a second side of the base member, the second guide member being disposed so as to be perpendicular to the upper surface of the base member while being at a right angle to the first guide member, and an inclination adjuster configured to adjust the inclination of the base member.

The electrode assembly may be a stacked type electrode assembly or a laminated/stacked type electrode assembly. In order to manufacture an electrode assembly configured to have a structure in which a plurality of unit cells is stacked as described above, the unit cells are moved by a mover, such as a conveyor belt, and drop onto an alignment apparatus such that the unit cells are stacked in the alignment apparatus. Concretely, a process of stacking the unit cells such that the rectangular planes of the unit cells are parallel to the upper surface of the base member is performed.

In the process in which the unit cells drop, however, the positions of the unit cells may deviate from each other in the height direction thereof.

Conventionally, an alignment apparatus configured to have a structure in which guide members are located at opposite sides of each of the unit cells is used. In the process in which the unit cells are settled between the guide members, however, the unit cells may be caught by the guide members, whereby the unit cells may be turned upside down, or in the case in which the degree of alignment of the stacked unit cells ends in failure as the result of increasing the distance between the guide members so as to be greater than the width of each of the unit cells in order to prevent the same, an additional alignment process becomes necessary.

The present invention uses a unit cell alignment apparatus configured to have a structure in which the first guide member and the second guide member are disposed at a position at which the first guide member and the second guide member are at right angles to each other. The unit cell alignment apparatus is configured to have a structure in which an inclination is formed in the direction in which the first guide member or the second guide member is located. In addition, it is possible to adjust the direction of inclination using the inclination adjustment member.

In the case in which the unit cells drop in the state in which the unit cell alignment apparatus is inclined, the unit cells may be aligned so as to inevitably overlap each other in the height direction due to the weight of the unit cells.

After the alignment is performed by the first guide member, alignment using the second guide member may be performed. The unit cells may be aligned so as to completely overlap each other in the height direction as the result of the two alignment operations.

The size of the base member may be equal to or greater than the planar size of the unit cell.

Concretely, the size of the base member may be 100% to 160%, specifically 120% to 140%, of the planar size of the electrode assembly.

In the case in which the size of the base member is less than the planar size of the electrode assembly, the dropping unit cells may not be settled on the base member but may deviate from the base member. Preferably, therefore, the size of the base member corresponds to the electrode assembly, or is greater than the planar size of the electrode assembly.

The base member is individually or simultaneously moved by the inclination adjustment member in a first direction, a second direction, a third direction, or a reverse direction thereof, the first direction is the direction in which the first edge is moved downwards, the second direction is the direction in which the second edge is moved downwards, and the third direction is the direction in which the vertex at which the base member, the first guide member, and the second guide member abut each other is moved downwards.

Preferably, the direction in which the base member is moved is inclined only in the first direction, the second direction, and the third direction in order to align the unit cells. In consideration of a process of removing the aligned electrode assembly, however, the base member may be inclined in directions opposite the first to third directions by the inclination adjustment member.

A vibration member configured to apply vibration to the unit cells may be added to the base member.

In the case in which, when a plurality of unit cells is stacked, the alignment of the unit cells is not easily performed only by adjusting the inclination of the base member due to the frictional force generated between the unit cells, vibration may be applied to the unit cells in order to align the unit cells such that they completely overlap each other.

The length of the first guide member may be 50% or more of the length of the overall length surface of each of the unit cells, from which no electrode tab protrudes, and the length of the second guide member may be 50% or less of the length of the overall width surface of each of the unit cells, from which an electrode tab protrudes, excluding the length of the electrode tab.

In the case in which the length of the first guide member is less than 50% of the length of the overall length surface of each of the unit cells, from which no electrode tab protrudes, the unit cells may deviate out of the base member, which is undesirable.

In addition, when the electrode tab collides with the second guide member, the electrode tab may be damaged, whereby the electrode tab may have defects and the safety of the electrode tab may be deteriorated.

In the case in which the length of the second guide member is greater than 50% of the length of the overall width surface of each of the unit cells, from which the electrode tab protrudes, excluding the length of the electrode tab, the electrode tab of each of the unit cells is laid over the second guide member when the unit cells are moved in the first direction, whereby the overall length surface of each of the unit cells, from which no electrode tab protrudes, is not adjacent to the first guide member and thus alignment is not performed.

The height of each of the first guide member and the second guide member may be equal to or greater than the height of the stacked unit cells.

In the case in which the height of each of the first guide member and the second guide member is less than the height of the stacked unit cells, the unit cells may drop out of the base member, whereby it is difficult to stack the unit cells.

Preferably, the unit cells are located lower than the height of each of the first guide member and the second guide member. Each of the first guide member and the second guide member may be configured to have a structure that is replaceable depending on the height of the stacked unit cells.

Each of the first guide member and the second guide member may include a plurality of discontinuous unit members, such as depicted in FIG. 7 and the unit members may be disposed only at one side of the base member.

In order to receive the stacked unit cells into a battery case, it is necessary to transfer the unit cells using a transfer apparatus. A recess, into which a transfer apparatus configured to transfer the stacked unit cells to another apparatus is inserted, may be provided in the upper surface of the base member, as depicted in FIG. 8.

The inclination adjustment member may include a tilting part configured to adjust the inclination of the base member and a rotary part configured to rotate the base member.

The inclination adjustment member may further include a support part configured to support the tilting part and the rotary part from the ground.

The base member may be inclined in the first to third directions by the tilting part, whereby the unit cells may be aligned with each other. The tilting part may have a structure configured to incline the base member only in any one of the first to third directions, or may have a structure configured to incline the base member 360 degrees, including the first to third directions.

For example, in the case in which the tilting part has a structure configured to be inclined only in the first direction even though it is necessary to align the unit cells in the second direction after the unit cells are aligned with each other in the first direction, it is necessary to rotate the base member. After the inclination of the base member is formed in the first direction, the base member may be rotated 90 degrees by the rotary member, and the unit cells may be aligned with each other while the inclination of the base member is formed in the second direction.

The inclination adjustment member may be configured to have a structure in which a plurality of pipes is telescopically connected to each other.

Concretely, a plurality of inclination adjustment members may be provided, and the length of one of the inclination adjustment members may become greater or less than the length of each of the other inclination adjustment members as the result of the telescopic movement of the pipes, whereby the inclination of the base member may be formed and thus the unit cells may be aligned with each other.

The rotary part may rotate the base member in a direction parallel to the ground such that, after the stacking of the unit cells is completed, the stacked unit cells are moved to the next step.

An alignment measurement member, configured to measure the alignment of the stacked unit cells, may be added to the unit cell alignment apparatus.

In the case in which there are unit cells that have not been aligned as the result of measurement of the degree of alignment of the unit cells using the alignment measurement member, the unit cells are further aligned using the inclination adjustment member and the vibration part. In the case in which all of the unit cells are aligned with each other, the unit cells are transferred to another apparatus, or other unit cells are successively stacked.

An electrode assembly manufacturing method using the unit cell alignment apparatus according to the present invention includes (a) transferring a plurality of unit cells and sequentially stacking the plurality of unit cells on a base member, (b) a step of aligning the stacked unit cells, and (c) a step of assembling the stacked and aligned unit cells.

Step (b) may be performed using the unit cell alignment apparatus.

In order to align the stacked unit cells at step (b), the inclination of the base member may be adjusted, or vibration may be applied to the stacked unit cells.

In the case in which the unit cells are transferred in the state in which the base member has an inclined structure, step (a) and step (b) may be simultaneously performed.

Step (a) and step (b) may be repeatedly performed a number of times in order to form an electrode assembly in which the unit cells are stacked, and then step (c) may be performed.

The present invention also provides a stacked type electrode assembly manufactured using the unit cell alignment apparatus.

Hereinafter, preferred embodiments of the present invention will be described in detail with reference to the accompanying drawings such that the preferred embodiments of the present invention can be easily implemented by those skilled in the art to which the present invention pertains. In describing the principle of operation of the preferred embodiments of the present invention in detail, however, a detailed description of known functions and configurations incorporated herein will be omitted when the same may obscure the subject matter of the present invention.

In addition, the same reference numbers will be used throughout the drawings to refer to parts that perform similar functions or operations. In the case in which one part is said to be connected to another part in the specification, not only may the one part be directly connected to the another part, but also, the one part may be indirectly connected to the another part via a further part. In addition, that a certain element is included does not mean that other elements are excluded, but means that such elements may be further included unless mentioned otherwise.

Embodiments of the present invention will be described in detail with reference to the accompanying drawings.

FIG. 1 is a perspective view showing a unit cell alignment apparatus according to an embodiment of the present invention.

FIG. 2 is a perspective view showing a unit cell alignment apparatus according to another embodiment of the present invention.

Referring to FIGS. 1 and 2, a unit cell alignment apparatus 100 or 200 according to the present invention includes a base member 110 or 210, a first guide member 120 or 220, a second guide member 130 or 230, and an inclination adjustment member 140 or 240.

A unit cell 300 used in the present invention may be an assembly in which electrodes and separators are alternately disposed and integrally coupled to each other. The unit cell is formed by sequentially disposing a positive electrode, a separator, a negative electrode, and a separator from above to below. However, the construction of the unit cell is not limited thereto. Various combinations using a positive electrode, a separator, and a negative electrode may be possible.

The base member 110 or 210 may have a plate shape, and unit cells 300 may be stacked on the base member.

The base member 110 or 210 is individually or simultaneously moved by the inclination adjustment member 140 or 240 in a first direction, a second direction, a third direction, or a reverse direction thereof.

The first direction is the direction in which the edge at which the base member 110 or 210 and the first guide member 120 or 220 abut each other is moved downwards about a y axis, the second direction is the direction in which the edge at which the base member 110 or 210 and the second guide member 130 or 230 abut each other is moved downwards about an x axis, and the third direction is the direction in which the vertex at which the base member 110 or 210, the first guide member 120 or 220, and the second guide member 130 or 230 abut each other is moved downwards.

At one side of the base member 110 or 210, the first guide member 120 or 220 is disposed so as to be perpendicular to the upper surface of the base member 110 or 210, and the second guide member 130 or 230 is disposed so as to be perpendicular to the upper surface of the base member 110 or 210 while being at right angles to the first guide member 120 or 220.

The inclination adjustment member 140 or 240 is disposed at the lower surface of the base member 110 or 210. A single inclination adjustment member may be provided, or two or more inclination adjustment members may be provided.

The inclination adjustment member 140 or 240 may form the inclination of the base member 110 or 210 in order to align the unit cells.

Concretely, the inclination adjustment member 140 or 240 may adjust the angle made with the base member 110 or 210 in order to form the inclination of the base member 110 or 210.

The base member 110 or 210 may be fixed in an inclined state, or may be inclined, may return to the original position thereof, and may be inclined again, which may be repeated.

Referring to FIG. 1, in the case in which the inclination adjustment member 140 is constituted by a single structure, the inclination adjustment member includes a support part 141, a tilting part 142, and a rotary part 144.

The support part 141 supports the base member 110 from the ground, and the tilting part 142 is disposed at the upper part of the support part 141 so as to be moved leftwards and rightwards in order to adjust the angle between the support part and the base member 110, thereby forming the inclination of the base member 110.

The rotary part 144 may rotate the base member 110 in a direction parallel to the ground in order to transfer the stacked unit cells to another apparatus.

Here, a joint 143, to which the tilting part 142 is rotatably connected, is further included. The joint, such as a ball and socket joint, allows rotation of the rotary part about the y axis so that the base member may rotate about the y-axis.

Referring to FIG. 2, four inclination adjustment members 241, 242, 243, and 244 are disposed at positions adjacent to the vertices of the lower surface of the base member 210.

Each of the inclination adjustment members 241, 242, 243, and 244 is configured to have a structure in which a plurality of pipes is telescopically connected to each other.

The structure of the inclination adjustment member of the unit cell alignment apparatus 100 is not particularly restricted, as long as the first guide member and the second guide member, which are disposed so as to be perpendicular to each other, are used and the unit cell alignment apparatus that is capable of aligning unit cells using the inclination adjustment member is used, as shown in FIG. 1. The structures shown in FIGS. 1 and 2 are merely concrete embodiments.

FIG. 3 is a perspective view showing the state in which the unit cell alignment apparatus 100 of FIG. 1 is moved in the second direction.

The base member 110 may be moved in the second direction while the tilting part 142 is moved leftwards and rightwards in order to align overall width surfaces, from which electrode tabs protrude.

In the case in which the base member 110 is rotated 90 degrees by the rotary part 144 and the tilting part 142 is moved leftwards and rightwards, the base member may be moved in the first direction in order to align overall length surfaces, from which no electrode tabs protrude.

In the case in which the base member 110 is rotated 45 degrees by the rotary part 144 and the tilting part 142 is moved leftwards and rightwards, the base member 110 may be moved in the third direction in order to simultaneously align the overall width surfaces, from which the electrode tabs protrude, and the overall length surfaces, from which no electrode tabs protrude.

FIG. 4 is a view showing that the unit cell alignment apparatus 200 of FIG. 2 is moved in the first direction.

Referring to FIG. 4, when the lengths of the inclination adjustment members 241 and 242 are increased, the base member 210 is moved in the first direction, whereby overall length surfaces, from which no electrode tabs protrude, become adjacent to the first guide member 220 and thus the unit cells 300 are aligned.

In the case in which the lengths of the inclination adjustment members 242 and 244 are increased, the base member 210 may be moved in the second direction in order to align overall width surfaces, from which electrode tabs protrude.

In the case in which the lengths of the inclination adjustment members 241, 242, and 244 are increased, the base member 210 may be moved in the third direction in order to simultaneously align the overall width surfaces, from which the electrode tabs protrude, and the overall length surfaces, from which no electrode tabs protrude.

In addition, a vibration member configured to apply vibration to the unit cells may be added to the base member 110 or 210, as depicted in FIG. 6.

The vibration member may generate vibration in the horizontal direction (x, y) based on the ground of the base member 110 or 210, or may generate vibration in the vertical direction (z) based on the ground of the base member 110 or 210. More preferably, the vibration member simultaneously generates vibration in the horizontal direction (x, y) and vibration in the vertical direction (z) based on the ground, or sequentially generates vibration in the horizontal direction (x, y) and vibration in the vertical direction (z) at a uniform time interval.

When a plurality of unit cells is stacked, the unit cells may not be smoothly moved due to the frictional force generated between the unit cells. In this case, the unit cells may be more effectively aligned by the vibration member.

A recess, into which a transfer apparatus configured to transfer the stacked unit cells to another apparatus is inserted, may be provided in the upper surface of the base member 110 or 210, as depicted in FIG. 8.

An alignment member configured to measure the alignment of the stacked unit cells may be added to the unit cell alignment apparatus, such as depicted in FIG. 9.

The alignment measurement member comprises laser pointers that abut the edges of the stack of unit cells. The edges of the stacked unit cells may be measured by the laser pointers to determine whether the stacked unit cells are aligned. The laser pointers may measure the distance and time reflected by irradiating a laser on the laser pointers. If the distances measured by the laser pointers are different from each other or different from the predetermined distances, the distances may be recognized and realigned.

Hereinbefore, the unit cell alignment apparatus according to the embodiment of the present invention has been described. Hereinafter, an electrode assembly manufacturing method using the unit cell alignment apparatus will be described.

An electrode assembly manufacturing method according to an embodiment of the present invention, which uses the unit cell alignment apparatus described above, includes:

(a) a step of transferring a necessary number of unit cells and sequentially stacking the unit cells on the base member;

(b) a step of aligning the stacked unit cells; and (c) a step of assembling the stacked and aligned unit cells.

FIG. 5 is a view showing that unit cells are transferred to the unit cell alignment apparatus through a unit cell transfer apparatus and are then stacked in the unit cell alignment apparatus.

Referring to FIG. 5, a plurality of unit cells supplied by the unit cell transfer apparatus 400 may drop downwards due to gravity, and may then be sequentially stacked on the base member.

In the case in which the unit cells are transferred in the state in which the base member is fixed in an inclined structure, step (a) and step (b) may be simultaneously performed.

In addition, at step (a) and step (b), the unit cells may be stacked and aligned one by one. That is, one cell may be stacked and aligned, and then the next cell may be stacked.

Although the preferred embodiments of the present invention have been described by way of illustration, the scope of the present invention is not limited to the specific embodiments described herein, and the present invention can be appropriately modified within the category described in the claims.

DESCRIPTION OF REFERENCE NUMERALS 100, 200: Unit cell alignment apparatuses
110, 210: Base members
111: Vibration member
112: Recess
120, 121, 220: First guide members
130, 230: Second guide members
140, 240, 241, 242, 243, 244: Inclination adjustment members
141: Support part
142: Tilting part
143: Joint
144: Rotary part
300: Unit cell
400: Unit cell transfer apparatus
500: Transfer apparatus
600: Alignment measurement member

INDUSTRIAL APPLICABILITY

As is apparent from the above description, according to the present invention, it is possible to stack unit cells used to manufacture a stacked type electrode assembly in the state of being accurately aligned. Consequently, it is possible to solve a problem in which the external appearance of a battery case is marred and a problem in which the degree of utilization of an electrode assembly reception part is deteriorated in the case in which the unit cells are received in the battery case in the state in which the unit cells are not completely aligned with each other.

Consequently, it is possible to maximally utilize an inner space of the battery case, whereby it is possible to maximally secure the capacity of a battery and to improve the energy density thereof.

The invention claimed is:

1. A unit cell alignment apparatus comprising:
   a base member having an upper surface for supporting a unit cell;
   a first guide member located at a first side of the base member, the first guide member being disposed so as to be perpendicular to the upper surface of the base member;
   a second guide member located at a second side of the base member, the second guide member being disposed so as to be perpendicular to the upper surface of the base member while being at a right angle to the first guide member;
   a support part below the base member;
   a tilting part between the support part and base member to adjust the angle of the base member relative to a horizontal plane; and
   a rotary part between the support part and base member to rotate the base member about an axis of rotation.

2. The unit cell alignment apparatus according to claim 1, wherein the base member is individually or simultaneously moved by the tilting part in a first direction, a second direction, a third direction, or a reverse direction thereof,
   wherein the first direction is a direction in which the first edge is moved downwards,
   wherein the second direction is a direction in which the second edge is moved downwards, and
   wherein the third direction is a direction in which a vertex at which the base member, the first guide member, and the second guide member abut each other is moved downwards.

3. The unit cell alignment apparatus according to claim 1, further comprising a vibration member configured to apply vibration to the unit cells.

4. The unit cell alignment apparatus according to claim 1, wherein a length of the first guide member is 50% or more of a length of an overall length surface of each of the unit cells, from which no electrode tab protrudes, and
   wherein a length of the second guide member is 50% or less of a length of an overall width surface of each of the unit cells, from which an electrode tab protrudes, excluding a length of the electrode tab.

5. The unit cell alignment apparatus according to claim 1, wherein a height of each of the first guide member and the second guide member is equal to or greater than a height of the stacked unit cells.

6. The unit cell alignment apparatus according to claim 1, wherein each of the first guide member and the second guide member comprises a plurality of discontinuous unit members, the unit members being disposed only at one side of the base member.

7. The unit cell alignment apparatus according to claim 1, wherein a recess, into which a transfer apparatus configured to transfer the stacked unit cells to another apparatus is inserted, is provided in the upper surface of the base member.

8. The unit cell alignment apparatus according to claim 1, wherein an alignment measurement member configured to measure an alignment of the stacked unit cells is above the base member.

9. The unit cell alignment apparatus according to claim 1, wherein the tiltable part comprises a U-shaped bracket rotatably connected to the support member.

10. The unit cell alignment apparatus according to claim 9, wherein the rotatable part is between the tiltable part and the base member.

11. The unit cell alignment apparatus according to claim 1, wherein the rotatable part is between the tiltable part and the base member.

12. The unit cell alignment apparatus according to claim 1, wherein the rotatable part comprises a ball and socket connection.

13. The unit cell alignment apparatus according to claim 1, further comprising grooves in a top surface of the base member, the grooves extending to an edge of the base member.

* * * * *